United States Patent [19]

Moustakas et al.

[11] 4,251,289
[45] Feb. 17, 1981

[54] GRADIENT DOPING IN AMORPHOUS SILICON

[75] Inventors: Theodore D. Moustakas, Berkeley Heights; Robert A. Friedman, Rahway; Christopher R. Wronski, Princeton, all of N.J.

[73] Assignee: Exxon Research & Engineering Co., Florham Park, N.J.

[21] Appl. No.: 108,024

[22] Filed: Dec. 28, 1979

[51] Int. Cl.³ .................... C23C 15/00; H01L 31/04
[52] U.S. Cl. .................... 136/255; 136/258; 148/188; 204/192 S; 204/192 P; 357/2; 357/15; 357/30
[58] Field of Search .............. 204/192 S, 192 P; 136/89 TF, 255; 357/2, 15, 30; 148/188

[56] References Cited

U.S. PATENT DOCUMENTS

| | | | |
|---|---|---|---|
| 3,271,637 | 9/1966 | Webb | 357/63 |
| 4,177,473 | 12/1979 | Ovshinsky | 357/2 |
| 4,177,474 | 12/1979 | Ovshinsky | 357/2 |
| 4,178,415 | 12/1979 | Ovshinsky et al. | 428/446 |

OTHER PUBLICATIONS

T. D. Moustakas, "Sputtered Hydrogenated Amorphous Silicon", *J. Electronic Materials*, vol. 8, pp. 391-435 (1979).
M. J. Thompson et al., "RF Sputtered Amorphous Silicon Solar Cells", Proceedings Int'l. Photovoltaic Solar Energy Conf., Luxembourg, (1977), pp. 231-240.
M. H. Brodsky et al., "Doping of Sputtered Amorphous Semiconductors", *IBM Tech. Disc. Bull.*, vol. 19, pp. 4802-4803 (1977).
P. M. Martin et al., "Property-Composition Relationships in Sputter-Deposited A-Si:H Alloys", *Solar Energy Materials*, vol. 2, pp. 143-157, (1979/1980).

*Primary Examiner*—Aaron Weisstuch
*Attorney, Agent, or Firm*—Paul E. Purwin

[57] ABSTRACT

An amorphous silicon semiconductor having a gradient doping profile is produced by thermo-electrically diffusing an ionizable deposit material such as antimony or aluminum, for example, into the amorphous silicon layer. Embodied in a photovoltaic device, the gradient doping profile increases the width of the depletion or barrier region and concurrently ensures an ohmic contact between amorphous silicon and current carrying electrodes.

9 Claims, 2 Drawing Figures

GRADIENT DOPING IN AMORPHOUS SILICON

FIELD OF THE INVENTION

The present invention relates to amorphous silicon and more particularly to amorphous silicon having a gradient doping profile.

BACKGROUND OF THE INVENTION

Hydrogenated amorphous silicon has been demonstrated as having favorable photoconductive properties, promising a viable alternative to crystalline materials such as single crystal silicon and germanium. Produced typically in a thin film form, amorphous silicon provides substantial material savings over its crystalline counterparts. The existing impediment to its widespread use is a low device efficiency relative to other materials. Although the material displays a favorable quantum efficiency of photogenerated charge carriers, other fundamental electrical properties of the semiconductor such as mobility, lifetime and diffusion length of carriers, for example, limit the efficiency of an amorphous silicon device. The resultant effect upon a device such as a solar cell is that the effective collection of photogenerated charge carriers is limited to the barrier region or the non-junction region is not electronically neutral, thereby impeding the transport of carriers generated in the barrier or depletion region.

The present invention deals with these deficiencies by selectively altering the amorphous silicon with an extrinsic dopant which both extends the effective field region of charge collection substantially throughout the amorphous silicon layer and concurrently improves the electrical characteristics of the non-junction or bulk region of the device. The dopant comprises an ionizable material such as antimony, for example, which is thermo-electrically diffused into the amorphous silicon layer during the sputter deposition of the silicon film.

The two principal methods of producing hydrogenated amorphous silicon are the glow discharge decomposition of silane and reactive sputtering in a plasma consisting of a mixture of argon and hydrogen. In either case the material has been doped N or P-type by adding to the discharge an amount of phosphine ($PH_3$) or diborane ($B_2H_6$); respectively. Solare cell structures have been fabricated from these materials utilizing abrupt junctions formed by gas phase doping. Such structures include for example Schottky barriers, p-i-n junctions and hetero-junction configurations. The Schottky barrier structure is a multilayer configuration consisting of a metallic substrate, a 500Å heavily phosphine doped a-Si layer ($n^{30}$), an intrinsic amorphous silicon layer, and a high work function semi-transparent metal contact. The thin $n+$ amorphous silicon layer, obtained by doping from a discharge containing $PH_3$, is used to form the ohmic contact to the intrinsic amorphous silicon layer.

PRIOR ART

The sputter deposition of photoconductive amorphous silicon is well known in the art. For example, Moustakas et al, in a technical publication entitled "Preparation of Highly Photoconductive Amorphous Silicon by Reactive Sputtering" Solid State Communications, Vol. 23, June 1977, teach the sputter deposition of photoconductive amorphous silicon in hydrogen.

SUMMARY OF THE INVENTION

The present invention provides a method of doping amorphous silicon. An extrinsic dopant such as antimony is thermo-electrically diffused into the amorphous silicon, altering its intrinsic semiconductor characteristics. The thermo-electrically diffused material provides a gradient doping profile through the majority of the silicon layer. Embodied in a photovoltaic device such as a solar cell, the present invention extends the effective field region of photogenerated charge collection substantially throughout the silicon layer while concurrently increasing the conductivity of the non-barrier or bulk region of the device. The doping process also produces an improved ohmic contact between the semiconductor and a conventional metal electrode.

DETAILED DESCRIPTION OF THE INVENTION

The present invention relates to an improved semiconductor device having a body of amorphous silicon which has been altered by thermo-electrically diffusing an extrinsic dopant material into the silicon layer.

Figure 1:
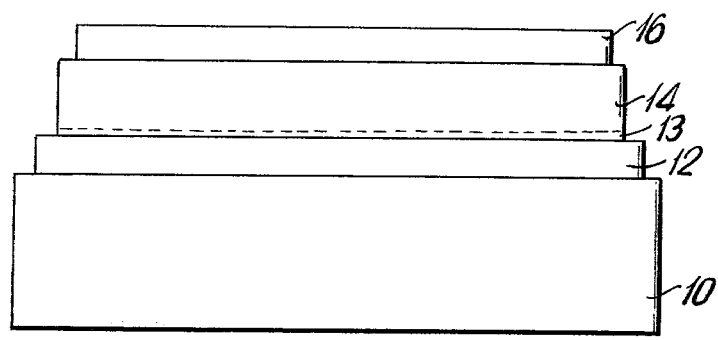
FIG. 1 is a cross-sectional view of the present invention embodied in a Schottky photodiode.

To illustrate this invention, FIG. 1 represents a Schottky junction photodiode having a body of amorphous silicon which has been altered by the doping technique taught herein. Accordingly, in FIG. 1, a substrate 10 provides a supportive base for the deposition of thin film materials. Substrate 10 comprises a material capable of withstanding the requisite processing temperatures of the overlaying layers described hereinafter. The substrate is preferably free from surface discontinuities of the order of one micron or less to avoid pinhole or similar deficiencies in the subsequently deposited films. The substrate is coated with a layer 12 of chromium (approximately 1000 Å in thickness) and a layer 13 of an ionizable dopant comprising antimony, phosphorous, aluminum, lithium, arsenic or a mixture thereof approximately 50 A to 100 Å in thickness. In a preferred embodiment, layer 13 comprises approximately 100 Å of antimony deposited by thermal evaporation. For the purpose of the present invention layer 13 comprises the ionizable dopant and the chromium layer 12 is primarily used for current conduction. This sequence of the two metallic layers is used since thick antimony layers do not adhere well to a glass substrate.

The substrate 10, coated with the layers 12 and 13, is secured to the anode electrode of a conventional radio frequency vacuum sputtering apparatus which is suitably modified to permit controlled heating and D.C. electrical biasing of the substrate. The substrate is heated to a temperature of between 200° C. and 300° C. and a D.C. positive bias ranging from about 30 volts to about 100 volts is applied to the substrate. Preferred ranges are 250°–300° C. and 50–100 volts. In the event that substrate 10 comprises an electrically insulating material, direct electrical contact is made between the biasing anode and layer 13, ensuring the application of the bias voltage to the dopant layer 13.

The biased and heated substrate is then subjected to a sputter deposition of intrinsic amorphous silicon layer 14. This deposition comprises, for example, evacuating the sputtering apparatus to a pressure of about $1-3 \times 10^{-7}$ Torr and back filling same with argon and hydrogen. The partial pressure of argon may range from about 10mTorr to about 20mTorr; the partial pressure of hydrogen may range from about 0.6mTorr to about 1mTorr, outside which range the doping technique taught herein will be ineffective due principally to the dominating effect of a deficiency or overabundance of hydrogen in the amorphous silicon film. The target, a polycrystalline silicon disk, 5" in diameter, is located 4.5 cm above the anode and is supplied with a power ranging from about 100 to 500 watts from a radio frequency, (hereinafter RF) power supply. At higher power densities (approximately 500 watts) the cathode is water cooled. At the lower power densities the cathode is permitted to reach an equilibrium temperature of about 200° C. These conditions result in a deposition rate between 2 to 4 Angstroms per second the film thickness varies between 1 micron and about 3 microns.

It is believed that the antimony reacts and dopes n-type the subsequently deposited layers of amorphous silicon. The elevated temperature of the substrate permits the dopant atoms to become positively ionized. During the subsequent silicon deposition, the ionized impurities assisted by the voltage bias diffuse and dope the depositing silicon layers under the driving force of the supplied positive bias. The thermo-electric diffusion produces a gradient composition of the dopant material, which is most concentrated near the origin of the dopant supply, decreasing in concentration through the film thickness. The gradient profile and the depth of penetration is controlled by the temperature-bias combination as taught herein.

A conventional junction forming layer 16, is deposited onto amorphous silicon layer 14. The junction may comprise a Schottky junction, p-n junction, heterojunction or similar such semiconductor junction, well known in the art. In one embodiment, a semi-transparent layer of a metal having a work function above about 4.5 electron volts (eV) is deposited onto the amorphous silicon to form a Schottky junction.

The diffused dopant is believed to displace the Fermi level of the intrinsic amorphous silicon toward the conduction band. The gradient composition doping profile through the silicon layer produces a monotonic decrease in the displacement of the Fermi level through the film. This results in a built-in field through the amorphous silicon layer, extending the region of photogenerated charge barrier collection substantially throughout the silicon layer. The displacement of the Fermi level toward the conduction band in the nonbarrier, bulk region of the device also increases the conductivity of the semiconductor material in this region, reducing the internal dissipative load of the device. In addition, the heavy doping of the amorphous silicon layer at the interface with the metal layer 13 ensures the ohmicity of this contact.

The performance of the previously described photovoltaic device was compared with an abrupt junction device formed by techniques known in the art.

Figure 2:
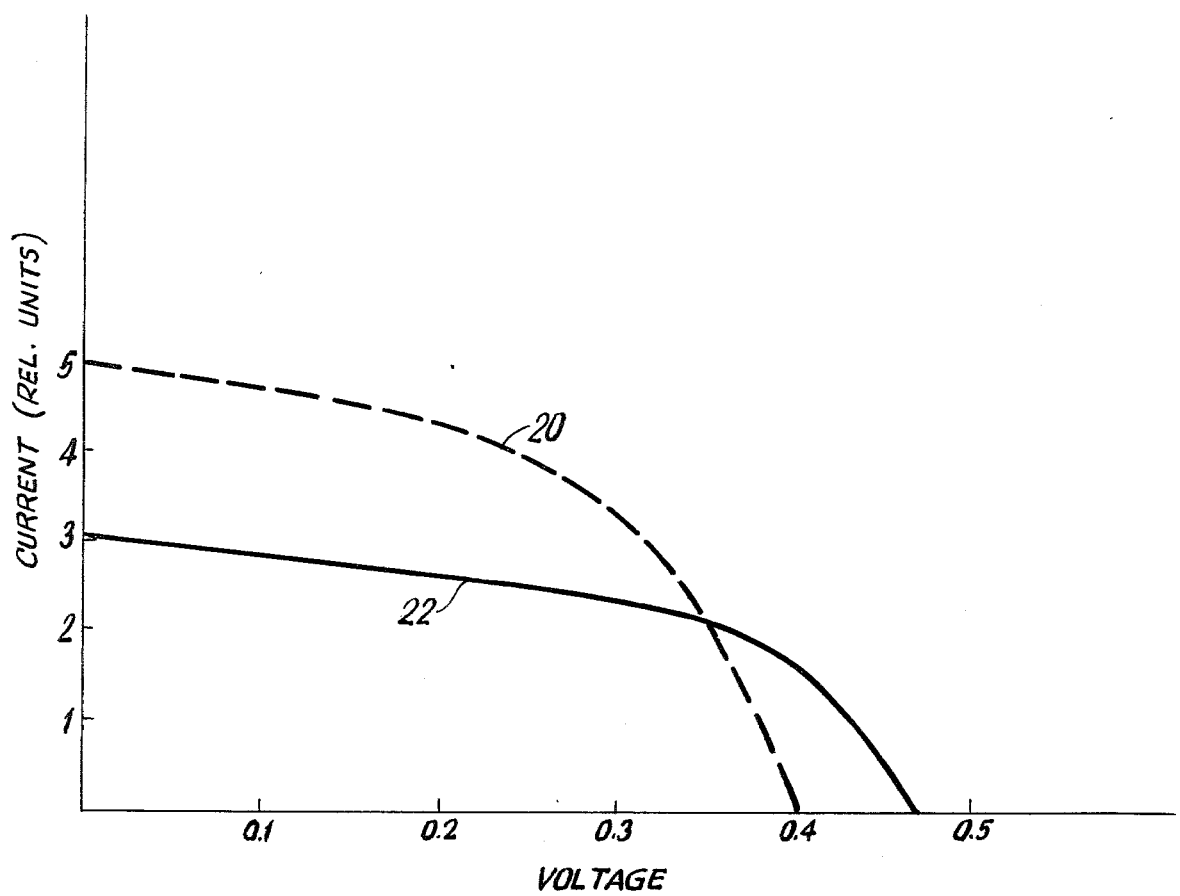
FIG. 2 is a plot of current versus voltage for two amorphous silicon photovoltaic devices, one of which includes the improved amorphous silicon of the present invention.

In this comparison photovoltaic device, the prior art technique of interposing an amorphous n+ a-Si layer between a current carrying metal layer and the intrinsic amorphous silicon layer is used to form an ohmic contact between the metal and the semiconductor. Referring to FIG. 2, there is shown a comparison of the photovoltaic current versus voltage characteristics of the two devices. Trace 20 represents the current versus voltage characteristics of an illuminated photovoltaic device have an antimony doping gradient as taught herein. Shown in contrast as trace 22 is the identically illuminated current versus voltage characteristic for a conventional amorphous silicon device, evidencing a substantial decrease in short circuit current and generally a decreased ability to deliver power to dissipative load.

To assist one skilled in the art in the practice of this invention the following example details the construction and electrical evaluation of photovoltaic devices having a body of amorphous silicon produced according to the present invention.

EXAMPLE 1

A plurality of borosilicate glass substrates were scrupulously cleaned to remove surface debris and then coated sequentially with a layer of chromium, approximately 1000 Å in thickness and a layer of antimony, approximately 100 Å in thickness. Both of these layers were deposited by resistance heating evaporation. The coated substrates were then placed on the anode of a conventional RF sputtering system. Electrical contact between the anode and the antimony layer was assured by physically contacting the antimony layer with electrically conductive screws secured to the anode. Another set of substrates coated with 1000 Å sputtered nichrome and 500 Å of $n^{30}$ a-Si deposited by glow discharge of silane containing 1% phosphine were affixed to the anode of the sputtering system, described heretofore. The anode and substrates were heated to 275° C. and supplied with a positive D.C. bias voltage of about 50 volts. The vacuum chamber, which had been evacuated to below $5 \times 10^{-7}$ Torr, was backfilled with partial pressures of hydrogen and argon of about $7.0 \times 10^{-4}$ Torr and $15 \times 10^{-3}$ Torr respectively. The target, a polycrystalline silicon disk, 5" in diameter, was not water cooled as in conventional sputtering units, and was supplied with R.F. power of 200 watts during the silicon deposition. The antimony layer, under the combined driving force of the applied bias voltage and the elevated temperature, diffused and doped the silicon layer. In contrast, the silicon deposited on the substrates coated with the n− a-Si substrates remained undoped.

The samples were cooled to room temperature, about 23° C., and then coated with a pellucid layer of palladium, which is known to form a Schottky junction to amorphous silicon. The samples were then subjected to conventional photoelectric measurements. A comparison of the antimony doped versus undoped samples revealed an increase of 65% in the short circuit photocurrent of the doped samples when illuminated with 100 mWatt $cm^2$ of simulated solar spectrum light. Conventional spectral dependence of collection efficiency measurements indicated a substantial increase in the width of the barrier or depletion region.

What is claimed is:

1. A method for producing a gradient doping profile in amorphous silicon comprising:
   (a) providing a substrate
   (b) coating said substrate with a layer of dopant material selected from the group consisting of antimony, phosphorous, aluminum, lithium, arsenic or a mixture thereof;

(c) RF sputter depositing a layer of photoconductive amorphous silicon while concurrently heating and applying a D.C. positive bias voltage to said dopant layer, where during said deposition the dopant material diffuses into the amorphous silicon layer under the combined driving forces of the applied bias voltage and the elevated temperature.

2. A method for producing an improved semiconductor device having a gradient doped semiconductor region, said method comprising:
   (a) providing a substrate having at least one surface comprising an electrical conductor;
   (b) coating said surface with a layer of dopant material selected from the group consisting of antimony, phosphorous, aluminum, lithium, arsenic or a mixture thereof;
   (c) RF sputter depositing a layer of photoconductive amorphous silicon on said coated surface while concurrently heating and applying a D.C. positive bias voltage to said dopant layer;
   (d) forming a junction on said amorphous silicon layer.

3. The method of claim 1 or 2 wherein said bias voltage ranges from about 30 volts to about 100 volts and said temperatures range from about 200° C. to about 300° C.

4. The method of claim 1 or 2 wherein said bias voltage ranges from about 50 volts to about 100 volts and said temperature is maintained between about 250° C. and about 300° C.

5. The method of claim 1 or 2 wherein said dopant layer comprises a 100 Angstrom thick layer of antimony.

6. The method of claim 2 wherein said amorphous silicon layer is between about 1 micron and about 3 microns in thickness.

7. The method of claim 2 wherein said semiconductor junction comprises a Schottky junction formed by depositing a layer of metal having a work function exceeding about 4.5 electron volts.

8. A photovoltaic device produced by the method of claim 7 and wherein said metal comprises palladium.

9. A method for forming an ohmic contact to intrinsic photoconductive amorphous silicon which comprises diffusing a layer of antimony into the surface of said amorphous silicon to be contacted by means of heating and applying a D.C. bias voltage to said antimony layer during the formation of the amorphous silicon layer on said antimony layer by RF sputtering.

* * * * *